United States Patent
Lin et al.

(10) Patent No.: US 10,281,819 B2
(45) Date of Patent: May 7, 2019

(54) SILICON-CONTAINING PHOTORESIST FOR LITHOGRAPHY

(71) Applicant: Taiwan Semiconductor Manufacturing Co., Ltd., Hsin-Chu (TW)

(72) Inventors: Li-Yen Lin, Yilan County (TW); Ching-Yu Chang, Yilang County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/837,232

(22) Filed: Dec. 11, 2017

(65) Prior Publication Data

US 2018/0101095 A1    Apr. 12, 2018

Related U.S. Application Data

(62) Division of application No. 15/072,635, filed on Mar. 17, 2016, now Pat. No. 9,857,684.

(51) Int. Cl.
| | | |
|---|---|---|
| G03F 7/38 | (2006.01) | |
| G03F 7/004 | (2006.01) | |
| G03F 7/038 | (2006.01) | |
| G03F 7/075 | (2006.01) | |
| H01L 21/027 | (2006.01) | |

(52) U.S. Cl.
CPC .......... G03F 7/0755 (2013.01); G03F 7/0046 (2013.01); G03F 7/038 (2013.01); G03F 7/0757 (2013.01); G03F 7/38 (2013.01); H01L 21/0274 (2013.01)

(58) Field of Classification Search
CPC .................................................. G03F 7/0758
See application file for complete search history.

(56) References Cited

U.S. PATENT DOCUMENTS

| | | | | |
|---|---|---|---|---|
| 6,323,287 B1 * | 11/2001 | Foster | ................... | B41C 1/1008 525/328.8 |
| 6,461,790 B1 | 10/2002 | Hatakeyama et al. | | |
| 6,780,563 B2 * | 8/2004 | Hasegawa | ............. | G03F 7/0758 430/270.1 |
| 6,783,917 B2 * | 8/2004 | Blakeney | ............. | C08G 77/442 430/270.1 |
| 8,216,767 B2 | 7/2012 | Wang et al. | | |
| 8,323,870 B2 | 12/2012 | Lee et al. | | |
| 8,580,117 B2 | 11/2013 | Kao et al. | | |
| 8,658,344 B2 | 2/2014 | Wang et al. | | |
| 8,715,919 B2 | 5/2014 | Chang et al. | | |
| 8,741,551 B2 | 6/2014 | Wu et al. | | |
| 2004/0034160 A1 * | 2/2004 | Malik | ................... | G03F 7/0046 524/588 |
| 2009/0233226 A1 | 9/2009 | Allen et al. | | |
| 2013/0323641 A1 | 12/2013 | Chang | | |
| 2014/0011133 A1 | 1/2014 | Liu et al. | | |
| 2014/0017615 A1 | 1/2014 | Chang | | |
| 2014/0017616 A1 | 1/2014 | Chang | | |
| 2014/0065843 A1 | 3/2014 | Chang et al. | | |
| 2014/0087294 A1 | 3/2014 | Iio et al. | | |
| 2014/0117563 A1 | 5/2014 | Yu et al. | | |
| 2014/0120459 A1 | 5/2014 | Liu et al. | | |
| 2014/0186773 A1 | 7/2014 | Chang | | |
| 2014/0255850 A1 | 9/2014 | Chang et al. | | |
| 2014/0272709 A1 | 9/2014 | Liu et al. | | |
| 2014/0272726 A1 | 9/2014 | Chang | | |
| 2014/0273521 A1 | 9/2014 | Wu et al. | | |
| 2017/0269478 A1 | 9/2017 | Lin et al. | | |

OTHER PUBLICATIONS

Kim et al "Chemically amplified resists based on norbornene polymer with 2-trimethylsilyl-2-propyl ester protecting group", Proc. SPIE 3999, Advances in Resist Technology and Processing XVII, (Jun. 23, 2000) pp. 1079-1087. (Year: 2000).*
Brewer Science, Inc. "DUV Anti-Reflective Coatings" date of 0x/0x/02, Rolla, MO, USA, 37 pages obtained world wide web with date of Aug. 20, 2004 and with Google search for pre 2011 dated web gages https://people.rit.edu/deeemc/reference_13/arcs/DUV%20ARC%20Overview.pdf. (Year: 2004).*
CAS Registry No. 68554-71-2, downloaded from SciFinder database on Nov. 27, 2016, 1 page.
Prashant K Kulshreshtha, Ken Maruyama, Sara Kiani, James Blackwell, Deirdre L Olynick and Paul D Ashby, "Harnessing entropic and enthalpic contributions to create a negative tone chemically amplified molecular resist for high-resolution lithography," Nanotechnology, Jul. 15, 2014, pp. 9, Nanotechnology 25 (2014) 315301, IOP Publishing Ltd., Printed in UK.

* cited by examiner

*Primary Examiner* — Cynthia Hamilton
(74) *Attorney, Agent, or Firm* — Haynes and Boone, LLP

(57) ABSTRACT

A photoresist includes a polymer backbone, an acid labile group (ALG) chemically bonded to the polymer backbone, a photo-acid generator (PAG), a solvent, and a silicon-containing unit that is chemically bonded to the ALG. A method of using the photoresist composition includes forming a layer of the photoresist over a substrate, performing an exposing process to the photoresist layer; and developing the photoresist layer, thereby forming a patterned photoresist layer. The patterned photoresist layer includes the silicon-containing unit.

19 Claims, 14 Drawing Sheets

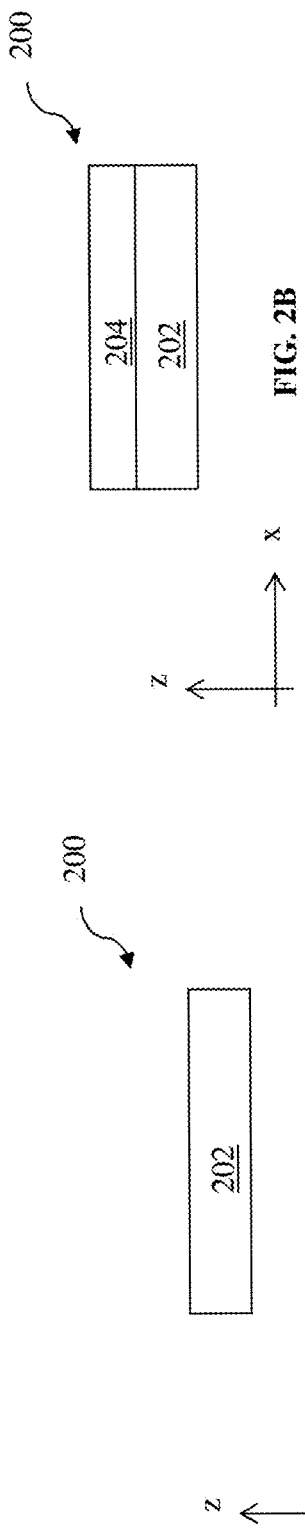
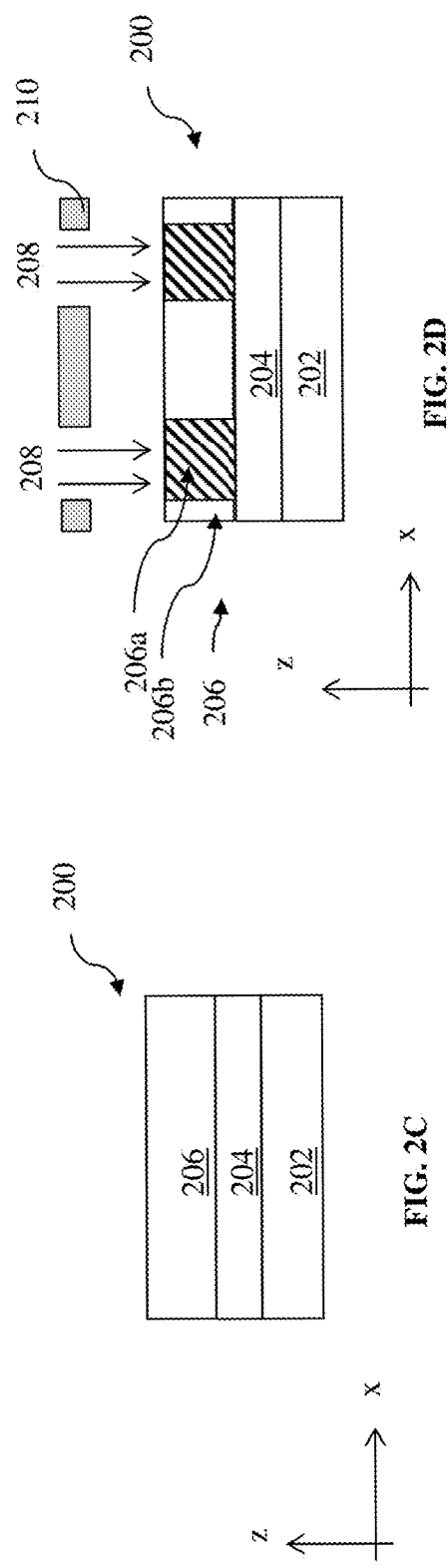
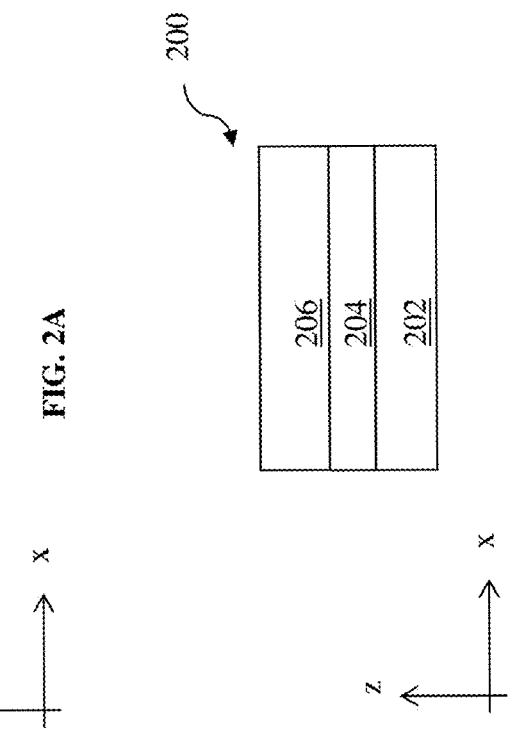

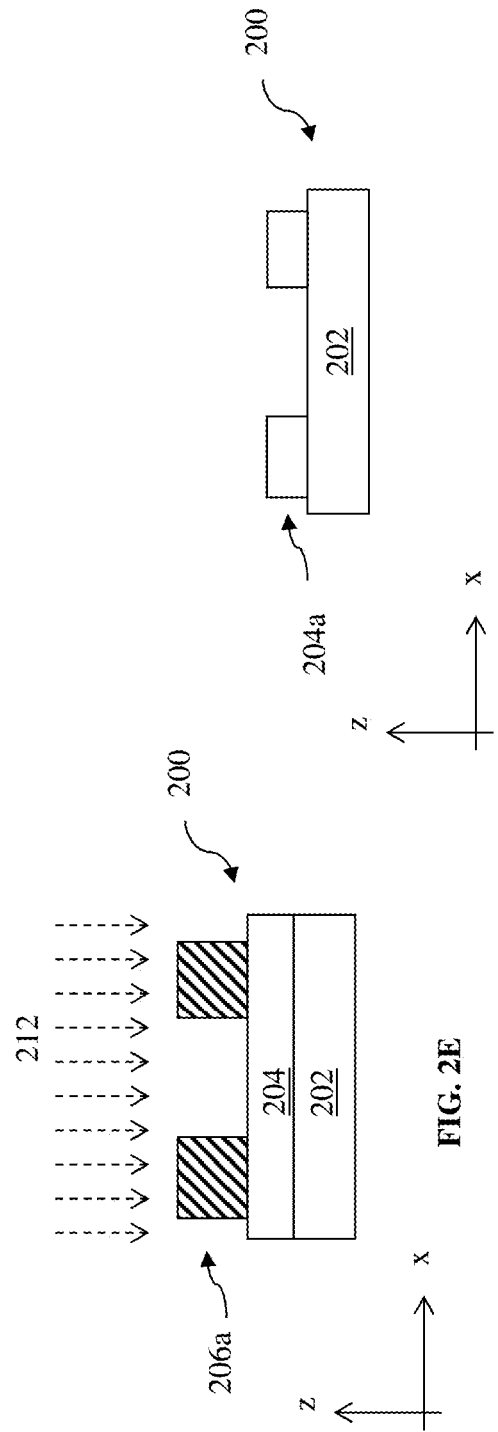

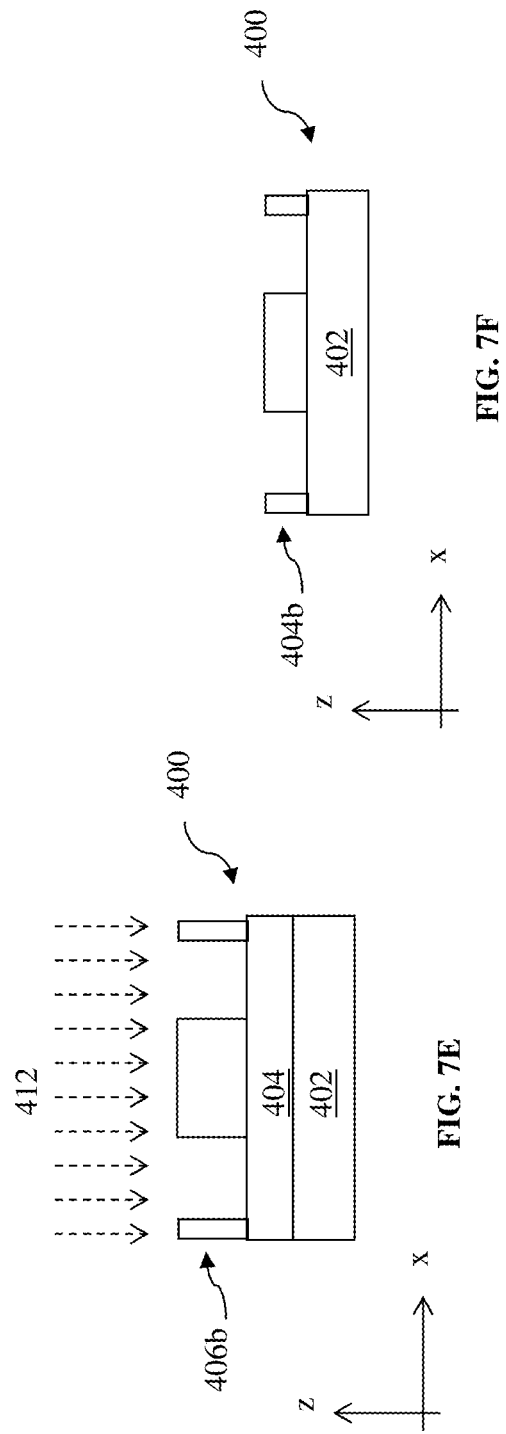

SILICON-CONTAINING PHOTORESIST FOR LITHOGRAPHY

PRIORITY DATA

This application is a divisional application of U.S. patent application Ser. No. 15/072,635, filed Mar. 17, 2016, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Photolithography has been used for patterning a substrate (e.g., a wafer) in order to form various features of an IC. In a typical photolithography process, a resist layer is formed over a substrate and is exposed to a radiation to form latent images of an IC. Subsequently, it is developed in a developer (a chemical solution) to remove portions of the resist layer, thereby forming a resist pattern. The resist pattern is then used as an etch mask in subsequent etching processes, transferring the pattern to an underlying material layer. To be used as an etch mask, the resist pattern must exhibit certain etching resistance in the subsequent etching processes. Presently, there is a need for new and improved resist materials that provide increased etching resistance over existing resist materials.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E, and 2F illustrate cross-sectional views of forming a target pattern according to the method of FIG. 1, in accordance with an embodiment.

FIGS. 7A, 7B, 7C, 7D, 7E, and 7F illustrate cross-sectional views of forming a target pattern according to the method of FIG. 1, in accordance with another embodiment.

DETAILED DESCRIPTION

Figure 1:
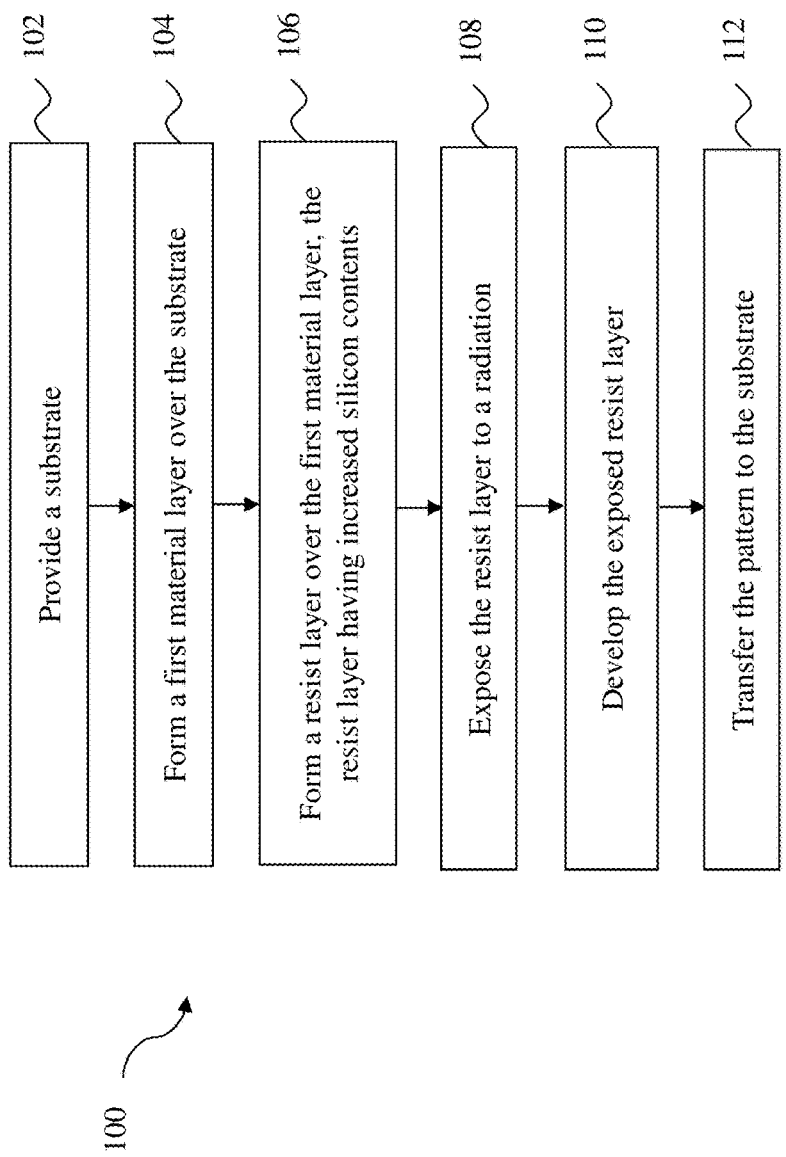
FIG. 1 illustrates a flow chart of a lithography patterning method according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to compositions of photosensitive layers in lithography and methods of using the same. In typical lithography patterning, a resist layer (or film) is spin-coated onto a substrate and is then exposed to a radiation. Subsequently, it is developed in a developer (a chemical solution), which removes portions (such as exposed portions in a positive-tone photoresist or unexposed portions in a negative-tone photoresist) of the resist layer, thereby forming a resist pattern. The resist pattern is then used as an etch mask in subsequent etching processes, transferring the pattern to an underlying material layer. Alternatively, the resist pattern may be used as an ion implantation mask in subsequent ion implantation processes applied to the underlying material layer, such as an epitaxial semiconductor layer.

Generally, to act as an etch mask, the resist pattern must have sufficient etching resistance. A higher etching resistance is desirable when the resist pattern is used as an etch mask for etching a thick resist under-layer, such as a spin-on coated (SOC) layer having silicon or metal contents. However, existing photoresist materials generally have insufficient etching resistance for etching such thick under-layers. To overcome this issue, typical lithography forms a thin hard mask layer between the resist pattern and the under-layer. The resist pattern is used as an etch mask for etching the thin hard mask layer which is then used as an etch mask for etching the under-layer. The material and process associated with the additional hard mask layer increase the total manufacturing costs. Thus, an object of the present disclosure is to provide new and improved photoresists that provide higher etching resistance than existing photoresists such that resist patterns formed with the new and improved photoresists can be used for directly etching thick resist underlayers.

There are generally two types of processes for developing exposed resist layers: a positive tone development (PTD) process and a negative tone development (NTD) process. In a PTD process, exposed areas of a resist layer are dissolved and removed by a developer. In an NTD process, unexposed areas of a resist layer are dissolved and removed by a developer. The PTD and NTD processes may use different developers. In the present disclosure, "exposed" areas of a resist layer are those areas of the resist layer that are exposed to a radiation energy above a predetermined threshold value of the resist layer such that they become insoluble (as in the NTD process) or soluble (as in the PTD process) after the exposure (and sometimes after a post-exposure baking (PEB) process as will be discussed later). Similarly, "unexposed" areas of a resist film are those areas of the resist film that remain soluble (as in the NTD process) or insoluble (as in the PTD process) after the exposure. An object of the present disclosure is to provide new and improved photoresists for both PTD and NTD processes.

FIG. 1 is a flow chart of a method 100 of patterning a substrate (e.g., a semiconductor wafer) according to various aspects of the present disclosure. The method 100 may be implemented, in whole or in part, by a system employing deep ultraviolet (DUV) lithography, extreme ultraviolet (EUV) lithography, electron beam (e-beam) lithography, x-ray lithography, ion beam lithography, and other lithography processes. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims.

In the following discussion, the method 100 is first described in conjunction with FIGS. 2A-2F wherein a semiconductor device 200 is fabricated by using embodiments of the method 100 in an NTD process. Then, the method 100 is described in conjunction with FIGS. 7A-7F wherein a semiconductor device 400 is fabricated by using embodiments of the method 100 in a PTD process. Each of the semiconductor devices 200 and 400 may be an intermediate device fabricated during processing of an IC, or a portion thereof, that may comprise SRAM and/or logic circuits, passive components such as resistors, capacitors, and inductors, and active components such as diodes, field-effect transistors (FETs), p-type FETs (PFETs), n-type FETs (NFETs), fin-like FETs (FinFETs), other three-dimensional (3D) FETs, metal-oxide-semiconductor FETs (MOSFET), complementary MOSFETs (CMOS), bipolar transistors, high voltage transistors, high frequency transistors, other memory cells, and combinations thereof.

Referring now to FIG. 1, the method 100 (FIG. 1) is provided with a substrate 202 (FIG. 2A) at operation 102. Referring to FIG. 2A, the substrate 202 includes one or more layers of material or composition. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium; a compound semiconductor such as silicon carbide, gallium arsenide, indium arsenide, and indium phosphide; an alloy semiconductor such as GaAsP, AlInAs, AlGaAs, InGaAs, GaInP, and/or GaInAsP; or combinations thereof. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

In an alternative embodiment, the substrate 202 is a mask substrate that may include a low thermal expansion material such as quartz, silicon, silicon carbide, or silicon oxide-titanium oxide compound. To further this example, the substrate 202 may be a mask substrate for making a deep ultraviolet (DUV) mask, an extreme ultraviolet (EUV) mask, or other types of masks.

At operation 104, the method 100 (FIG. 1) forms a material layer 204 over the substrate 202 (FIG. 2B). Referring to FIG. 2B, in an embodiment, the material layer 204 includes a dielectric material such as amorphous silicon (a-Si), silicon oxide, silicon nitride (SiN), titanium nitride, aluminum oxide, or other suitable material or composition. In an embodiment, the material layer 204 is an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In some embodiments, the substrate 202 includes a patterning layer as its top layer and the method 100 may skip the operation 104 without forming the material layer 204.

At operation 106, the method 100 (FIG. 1) forms a photoresist (or resist) layer 206 over the substrate 202, and particularly over the material layer 204 in the present embodiment. Referring to FIG. 2C, in an embodiment, the resist layer 206 is formed by spin-on coating a liquid polymeric material over the material layer 204. In an embodiment, the resist layer 206 is further treated with a soft baking process and a hard baking process. In an embodiment, the resist layer 206 is sensitive to a radiation, such as an I-line light, a DUV light (e.g., 248 nm radiation by krypton fluoride (KrF) excimer laser or 193 nm radiation by argon fluoride (ArF) excimer laser), a EUV light (e.g., 13.5 nm light), an e-beam, an x-ray, and an ion beam. Further in the present embodiment, the resist layer 206 is an NTD resist, i.e., its solubility in a NTD developer decreases upon the radiation.

In an embodiment, the material layer 204 is also a polymeric material and is also spin-on coated onto the substrate 202. To further this embodiment, the material layer 204 and the resist layer 206 have different optical properties with respect to the radiation. For example, the material layer 204 may have a substantially different refractive index (n), extinction coefficient (k), or spectroscopic transmittance (T) than the resist layer 206.

In the present embodiment, the resist layer 206 includes a photosensitive chemical, a polymeric material having one or more acid labile groups (ALG), and a solvent. The photosensitive chemical may be a photo-acid generator (PAG) that produces an acid upon radiation. The acid cleaves the ALGs off the polymeric material in a chemical amplification reaction. In the present embodiment, the resist layer 206 further includes a silicon-containing unit that can be chemically bonded to the polymeric material after the ALGs have been cleaved. The silicon-containing unit advantageously increases the etching resistance of the resist layer 206 for subsequent etching processes.

Figure 3A:
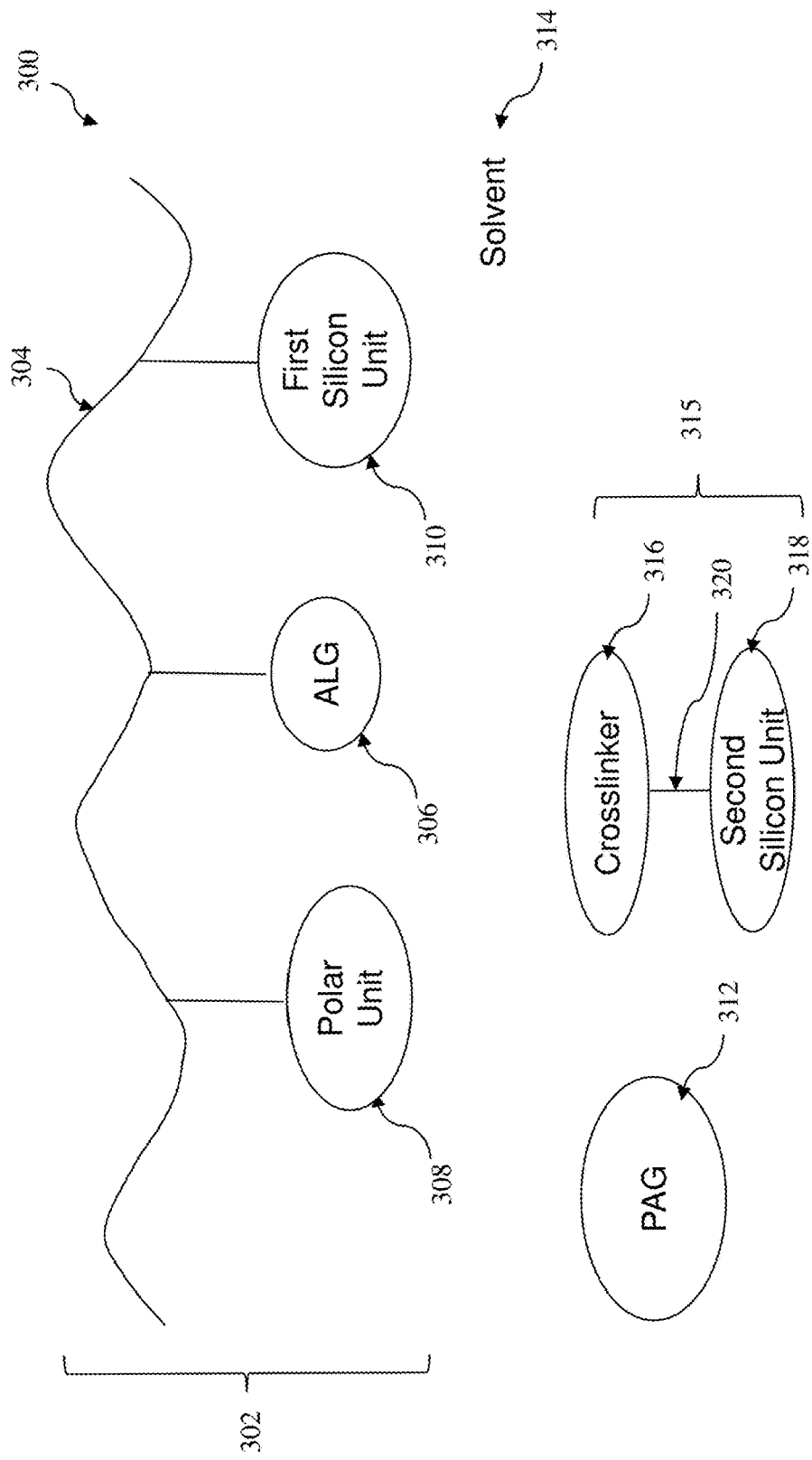
FIGS. 3A and 4A illustrate exemplary structures of a photoresist constructed according to aspects of the present disclosure.

FIG. 3A shows an embodiment of a resist material 300, in portion, included in the resist layer 206, constructed in accordance with some embodiments of the present disclosure. The resist material 300 includes a first polymer 302, a PAG 312, and a solvent 314. The first polymer 302 includes a polymer backbone 304 and an ALG 306 chemically bonded to the polymer backbone 304. In the present embodiment, the first polymer 302 further includes a polar unit 308 and a first silicon-containing unit 310, both of which are chemically bonded to the polymer backbone 304. The polar unit 308 is generally capable of increasing adhesion of the resist layer 206 with an under-layer such as the material layer 204. In some embodiments, the polar unit 308 may be hydroxyl adamantane, norbornane lactone, γ-butyrolactone, and derivatives thereof. The first silicon-containing unit 310 serves to increase the etching resistance of the resist layer 206. In the present embodiment, the resist material 300 further includes an etching resistance enhancement (ERE) unit 315. The ERE unit 315 includes a crosslinker 316 and a second silicon-containing unit 318 that is chemically bonded to the crosslinker 316. The crosslinker 316 and the silicon-containing unit 318 may be directly bonded or indirectly bonded through an intermediate bonding unit 320. In the present embodiment, the PAG 312 and the ERE 315 are blended with the polymer 302 in the solvent 314. The blending of the various components in the solvent 314 may be done by a photoresist provider or at the site of a semiconductor manufacturer. The ERE 315, particularly the second silicon-containing unit 318, serves to further increase the etching resistance of the resist layer 206. This aspect will become more evident after the discussion of operation 108. In some embodiments, the resist material 300 further includes a quencher for neutralizing excessive acids produced by the PAG 312 and/or for suppressing resist outgassing. The quencher may be amine derivatives including primary, secondary, tertiary aliphatic or aromatic amine, in some embodiments. In some further embodiments, the resist material 300 includes a surfactant for reducing surface tension between the resist layer 206 and the material layer 204. In various embodiments, the molecular weight of the resist material 300 ranges from 1,000 to 20,000.

At operation 108, the method 100 (FIG. 1) exposes the resist layer 206 to a radiation beam 208 in a lithography system. Referring to FIG. 2D, some portions 206a (shaded areas) of the resist layer 206 are exposed by the radiation beam 208, and other portions 206b of the resist layer 206 remain unexposed. The radiation beam 208 may be an I-line light (365 nm), a DUV radiation such as KrF excimer laser (248 nm) or ArF excimer laser (193 nm), a EUV radiation (e.g., 13.5 nm), an e-beam, an x-ray, an ion beam, or other suitable radiations. Operation 108 may be performed in air, in a liquid (immersion lithography), or in a vacuum (e.g., for EUV lithography and e-beam lithography). In an embodiment, the radiation beam 208 is patterned with a mask 210, such as a transmissive mask or a reflective mask, which may include resolution enhancement techniques such as phase-shifting and/or optical proximity correction (OPC). The mask 210 includes various patterns for forming IC features in or on the substrate 202. In another embodiment, the radiation beam 208 is directly modulated with a predefined pattern, such as an IC layout, without using a mask (e.g., maskless lithography using e-beam).

In the present embodiment, the exposed portions 206a undergo some chemical changes in response to the radiation 208. For example, with respect to FIG. 3A, the PAG 312 releases an acid in response to the radiation 208. The acid cleaves the ALG 306 off the polymer backbone 304, which makes the polymer 302 more hydrophilic. As a result, the exposed portions 206a become insoluble in an organic developer, such as n-butyl acetate (n-BA). In some embodiments, the method 100 further performs a post-exposure baking (PEB) process to the exposed resist layer 206. The PEB process accelerates the above acid-generation and cleaving reactions. In an embodiment, the PEB process may be performed in a thermal chamber at a temperature ranging between about 120 degrees Celsius (° C.) to about 160° C.

Figure 3B:
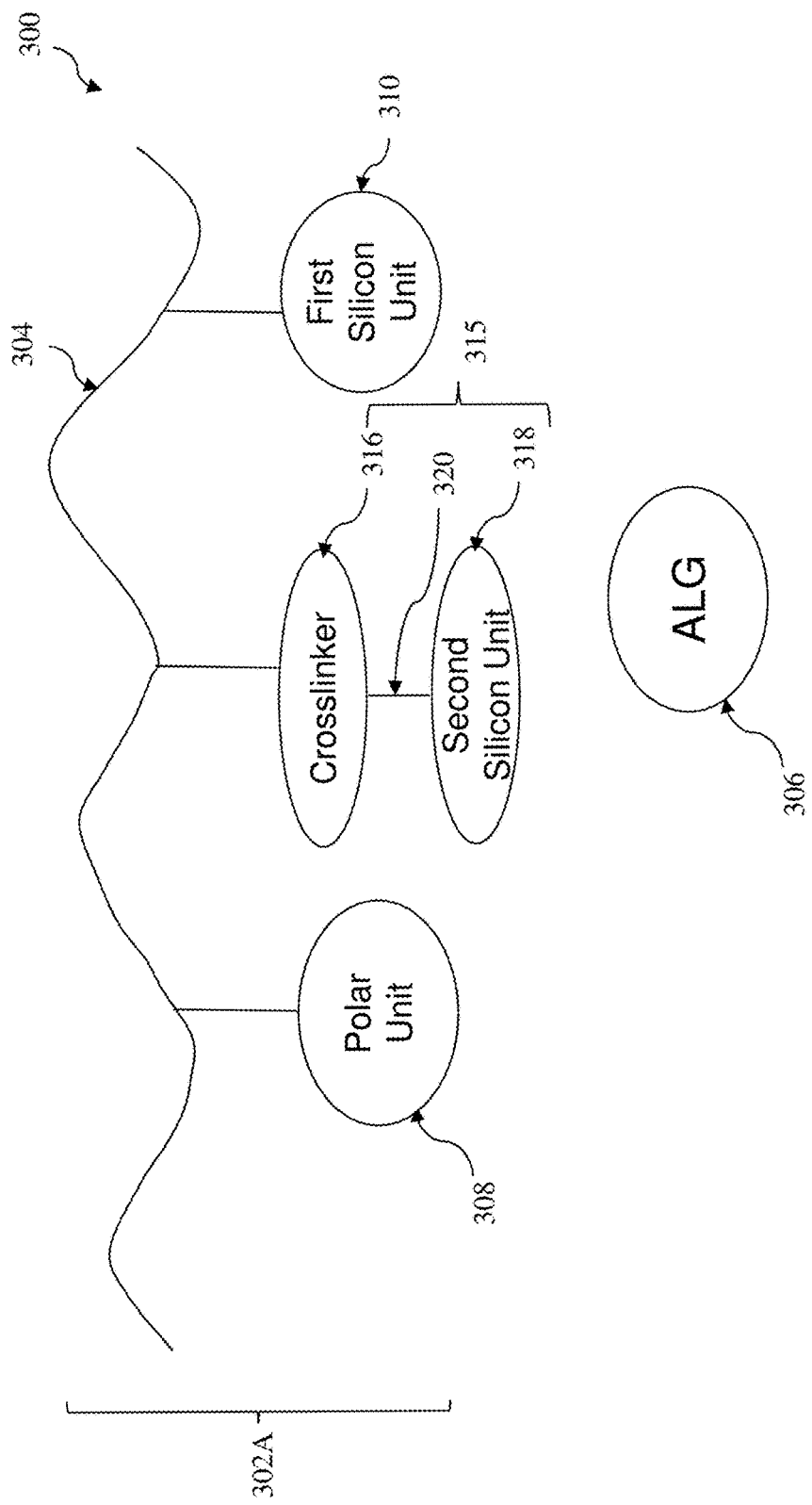
FIGS. 3B and 4B illustrate structures of the photoresist of FIGS. 3A and 4A, respectively, during a step performed in the method of FIG. 1, in accordance with an embodiment.

In the present embodiment, the ERE unit 315 (FIG. 3A) is designed such that the crosslinker 316 reacts with the sites of the polymer backbone 304 that have lost the ALG 306 due to the above cleaving reactions. A net effect is that the ERE unit 315 replaces the ALG 306 during the exposure operation 108 and/or during the PEB process. A resultant polymer 302A, in portion, is shown in FIG. 3B. Referring to FIG. 3B, in the present embodiment, the polymer 302A includes the polymer backbone 304 and the ERE unit 315 chemically bonded to the polymer backbone 304. The polymer 302A further includes the polar unit 308 and the first silicon-containing unit 310 that are chemically bonded to the polymer backbone 304. The ALG 306 has been cleaved off the polymer backbone 304 and will be removed in subsequent processes. The polymer 302A advantageously provides increased etching resistance to the exposed portions 206a due to the inclusion of the second silicon-containing unit 318.

Figure 4A:
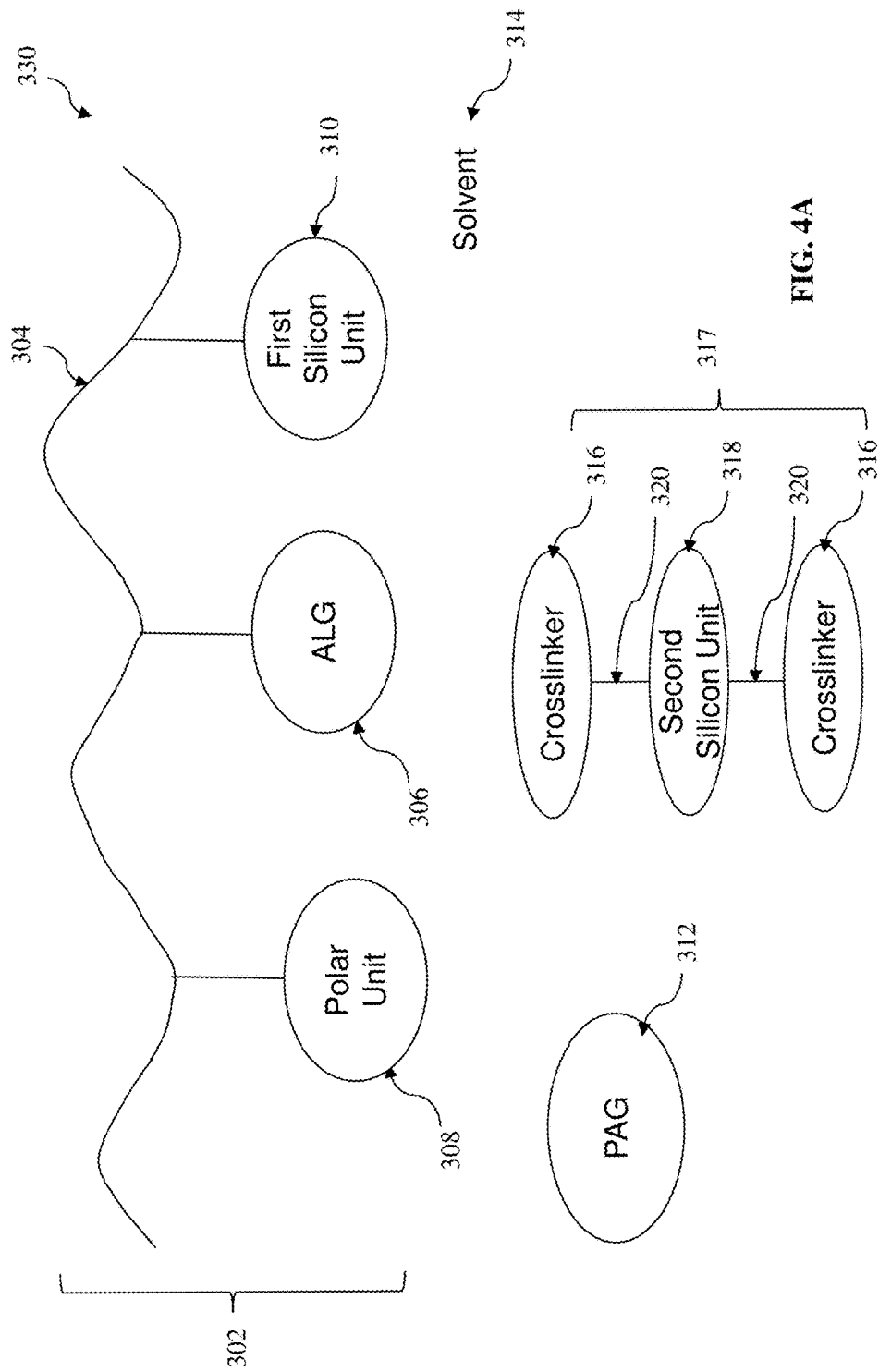

FIG. 4A shows an embodiment of another resist material 330, in portion, for the resist layer 206, constructed in accordance with some embodiments of the present disclosure. Referring to FIG. 4A, the resist material 330 includes the polymer 302, the PAG 312, and the solvent 314 as discussed with respect to FIG. 3A. The polymer 302 includes the polymer backbone 304 with the ALG 306, the polar unit 308, and the silicon-containing unit 310 chemically bonded with the polymer backbone 304. The resist material 330 further includes an etching resistance enhancement (ERE) unit 317. The ERE unit 317 includes two crosslinkers 316 that are chemically bonded with one silicon-containing unit 318. The two crosslinkers 316 may be directly bonded with the silicon-containing unit 318, or indirectly bonded with the silicon-containing unit 318 through two intermediate bonding units 320.

Figure 4B:
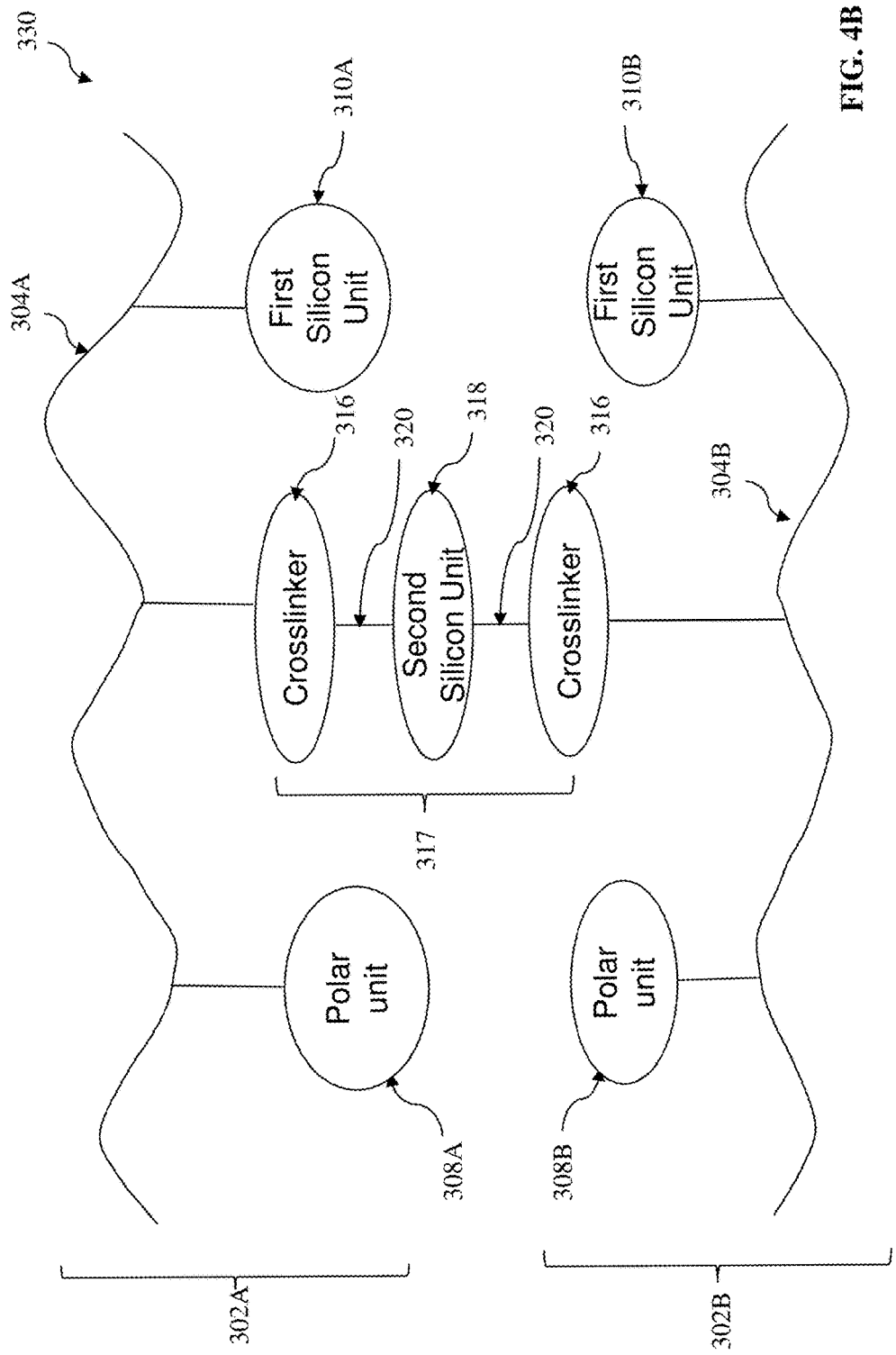

FIG. 4B illustrates a portion of the structure of the resist material 330 in the exposed portions 206a. Referring to FIG. 4B, the ALGs 306 have been cleaved off two polymers 302A and 302B, each of which is an example of the polymer 302 of FIG. 4A. For example, the polymer 302A includes a polymer backbone 304A, a polar unit 308A, and a first silicon-containing unit 310A; while the polymer 302B includes a polymer backbone 304B, a polar unit 308B, and a first silicon-containing unit 310B. Further, the ERE unit 317 crosslinks the two polymers 302A and 302B to form a larger polymer during the exposing operation 108 and/or the subsequent PEB process. The ERE unit 317 provides not only extra silicon contents but also larger polymers to the exposed portions 206a for improving the etching resistance thereof.

Figure 5:
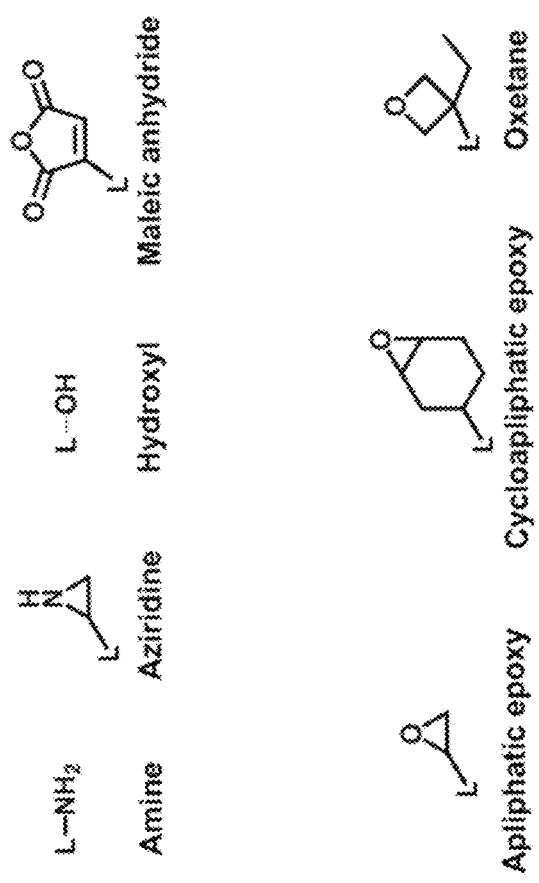
FIG. 5 illustrates exemplary structures of a crosslinker component in a photoresist constructed according to aspects of the present disclosure.

In an embodiment, the crosslinker 316 of the resist materials 300 and 330 comprises amine, aziridine, hydroxyl, aliphatic epoxy, cycloaliphatic epoxy, oxetane, or maleic anhydride. Exemplary chemical structures of the crosslinker 316 are shown in FIG. 5. In each of the chemical structures in FIG. 5, the symbol "L" represents the intermediate bonding unit 320.

Figure 6A:
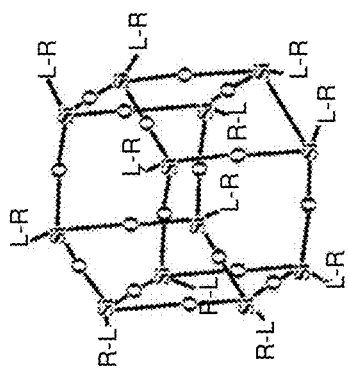
FIGS. 6A, 6B, 6C, 6D, 6E, 6F, and 6G illustrate exemplary structures of a silicon-containing component in a photoresist constructed according to aspects of the present disclosure.
Figure 6B:
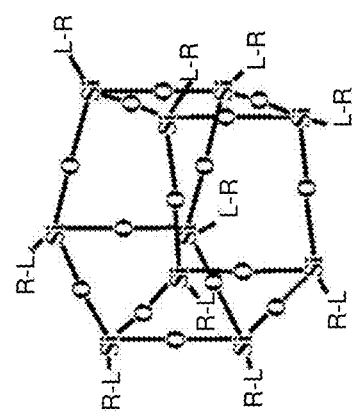
Figure 6C:
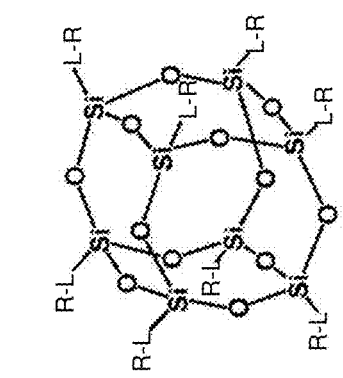
Figure 6D:
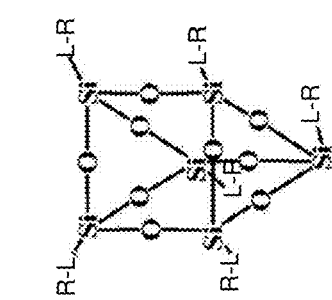
Figure 6F:
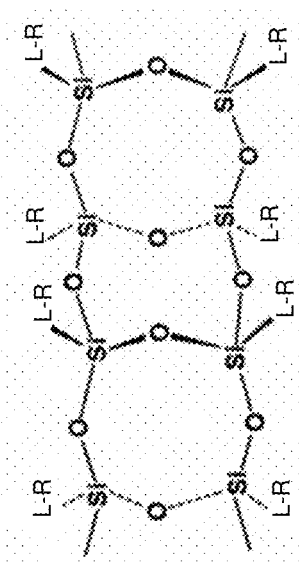
Figure 6G:
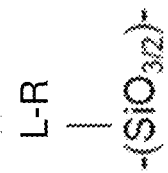
Figure 6E:
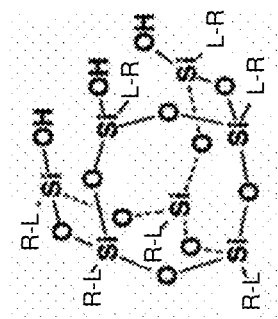

In an embodiment, the silicon-containing unit 318 includes silicon-oxygen bonds. In an embodiment, the silicon-containing unit 318 includes a silsesquioxane. For example, the silicon-containing unit 318 may be a cage-type silsesquioxane such as shown in FIGS. 6A, 6B, 6C, and 6D. The silicon-containing unit 318 may also be other types of silsesquioxane. For example, the silicon-containing unit 318 may be an incomplete-cage type silsesquioxane such as shown in FIG. 6E, a ladder type silsesquioxane such as shown in FIG. 6F, or a random type silsesquioxane such as shown in FIG. 6G. In each of the FIGS. 6A-6G, the symbol "R" represents the crosslinker 316 and the symbol "L" represents the intermediate bonding unit 320.

In an embodiment, the intermediate bonding unit 320 has an aromatic ring structure. Alternatively, the intermediate bonding unit 320 has a chain structure with 0 to 6 carbon atoms. For example, the chain may be a linear chain or a cyclic chain. Further, the chain may comprise an alkyl group, an alkoxy group, a fluoro alkyl group, or a fluoroalkoxy group.

At operation 110, the method 100 (FIG. 1) develops the exposed resist layer 206 in a developer 212 (FIG. 2E). Referring to FIG. 2E, unexposed portions 206b are removed by the developer 212 (negative tone imaging), leaving the exposed portions 206a over the material layer 204 as a resist pattern 206a. In some embodiments, the resist layer 206 experiences a polarity change after the operation 108 and/or the PEB process discussed above, and a dual-tone developing process may be implemented. In some examples, the resist layer 206 is changed from a nonpolar state (hydrophobic state) to a polar state (hydrophilic state), then the unexposed portions 206b will be removed by an organic solvent, such as n-BA or its derivative. In some other examples, the resist layer 206 is changed from a polar state to a nonpolar state, then the unexposed portions 206b will be removed by an aqueous solvent such as having 2.38% tetramethyl ammonium hydroxide (TMAH).

At operation 112, the method 100 (FIG. 1) transfers the resist pattern 206a to the substrate 202. Referring to FIG. 2F, in the present embodiment, the operation 112 includes etching the material layer 204 with the resist pattern 206a as an etch mask, thereby transferring the pattern from the resist pattern 206a to the material layer 204. In an embodiment, the material layer 204 is a spin-on coated layer having metal or silicon contents. Due to the increased etching resistance of the resist pattern 206a, the operation 112 is able to fully etch the material layer 204 to form a pattern 204a. The operation 112 may use a dry (plasma) etching, a wet etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The resist pattern 206a may be partially consumed during the etching of the material layer 204. In an embodiment, any remaining portion of the resist pattern 206a may be stripped off, leaving the patterned material layer 204a over the substrate 202, as illustrated in FIG. 2F.

Figure 7A:
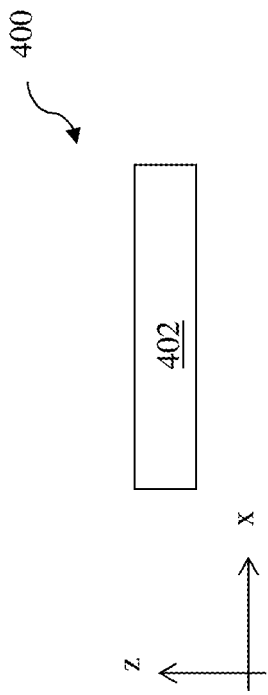
Figure 7B:
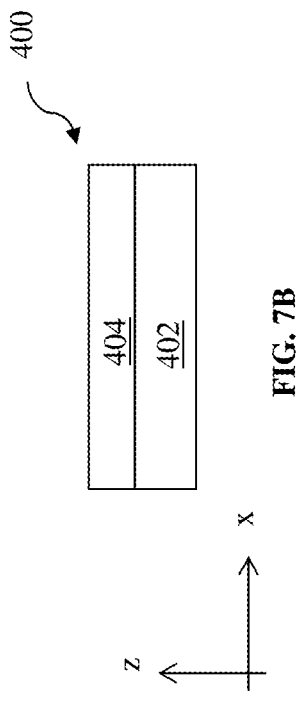

FIGS. 7A-7F illustrate cross-sectional views of the semiconductor device 400 during various stages of fabrication according to an embodiment of the method 100 in a PTD process. Referring to FIGS. 1 and 7A, the method 100 is provided with a substrate 402 at operation 102. The substrate 402 may be similar to the substrate 202. Referring to FIGS. 1 and 7B, the method 100 forms a material layer 404 over the substrate 402 at operation 104. The material layer 404 may be similar to the material layer 204. However, various properties of the material layer 404 are designed to work with a resist layer 406 to be formed thereon.

Figure 7C:
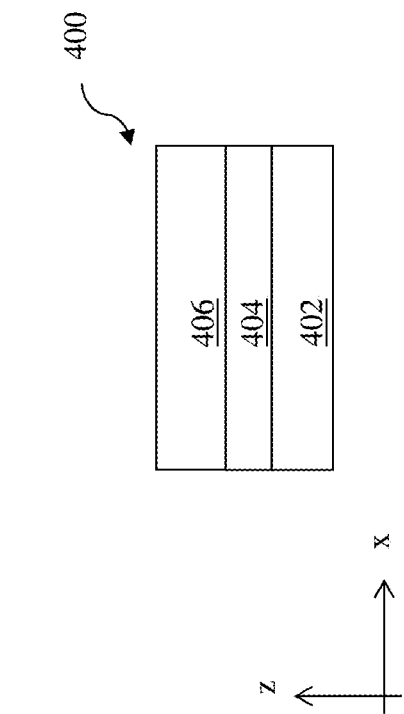

Referring to FIGS. 1 and 7C, the method 100 forms a photoresist (or resist) layer 406 over the substrate 402, and particularly over the material layer 404 in the present embodiment. In an embodiment, the resist layer 406 is formed by spin-on coating a liquid polymeric material over the material layer 404. In an embodiment, the resist layer 406 is further treated with a soft baking process and a hard baking process. In an embodiment, the resist layer 406 is sensitive to a radiation, such as an I-line light, a DUV light (e.g., 248 nm radiation by krypton fluoride (KrF) excimer laser or 193 nm radiation by argon fluoride (ArF) excimer laser), a EUV light (e.g., 13.5 nm light), an e-beam, an x-ray, and an ion beam. Further in the present embodiment, the resist layer 406 is a PTD resist, i.e., its solubility in a PTD developer increases upon the radiation.

In an embodiment, the material layer 404 is also a polymeric material and is spin-on coated onto the substrate 402. To further this embodiment, the material layer 404 and the resist layer 406 have different optical properties with respect to the radiation. For example, the material layer 404 may have a substantially different refractive index (n), extinction coefficient (k), or spectroscopic transmittance (T) from the resist layer 406.

In the present embodiment, the resist layer 406 includes a photosensitive chemical, a polymeric material having one or more acid labile groups (ALG), and a solvent. The photosensitive chemical may be a photo-acid generator (PAG) that produces an acid upon radiation. The acid cleaves the ALGs off the polymeric material in a chemical amplification reaction. In the present embodiment, the resist layer 406 further includes a silicon-containing unit that is chemically bonded to the ALG. The silicon-containing unit advantageously increases the etching resistance of unexposed portions of the resist layer 406 for subsequent etching processes.

Figure 8A:
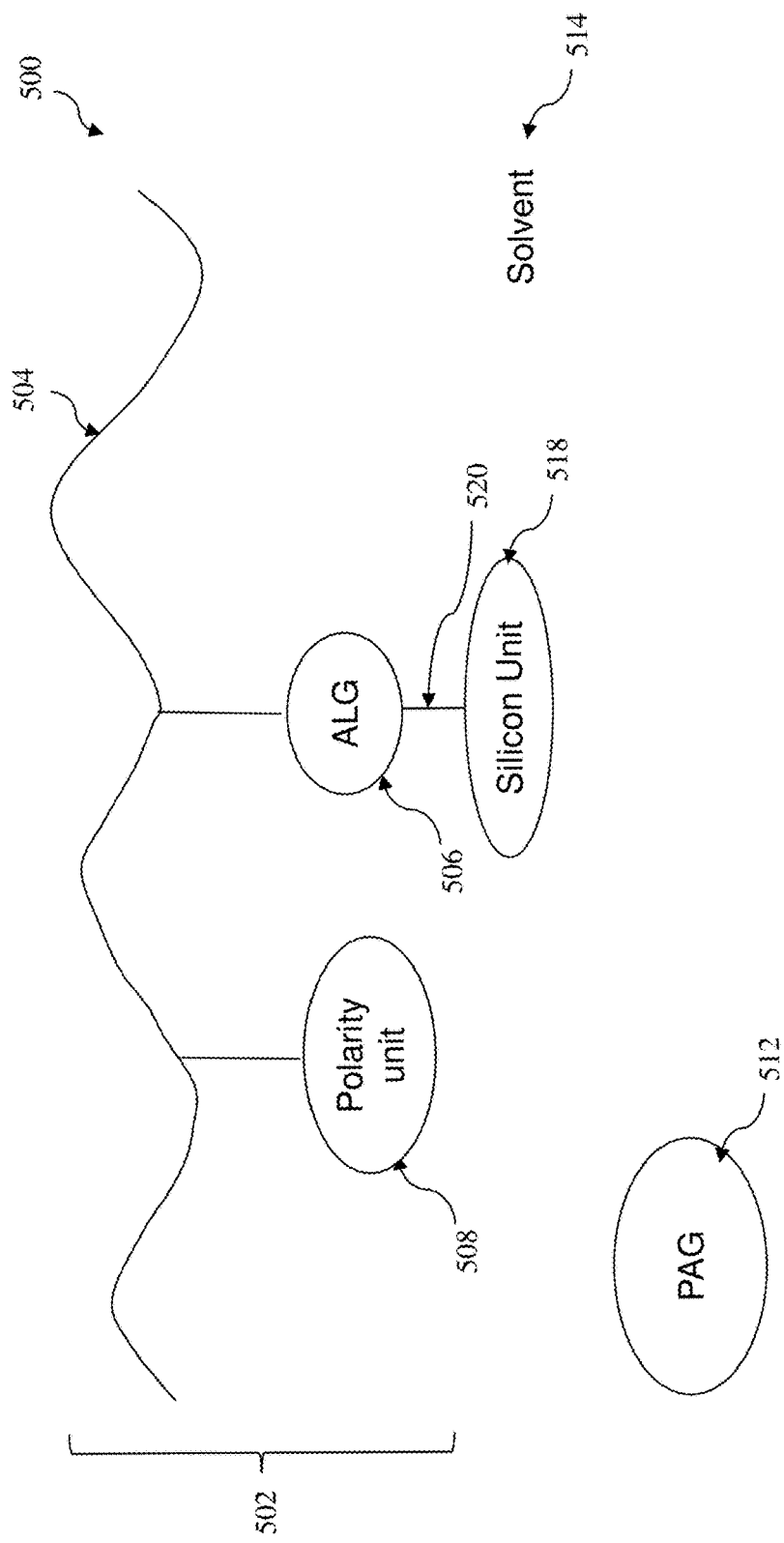
FIG. 8A illustrates an exemplary structure of a photoresist constructed according to aspects of the present disclosure.

FIG. 8A shows an embodiment of a resist material 500, in portion, that is included in the resist layer 406, constructed in accordance with some embodiments of the present disclosure. Referring to FIG. 8A, the resist material 500 includes a first polymer 502, a PAG 512, and a solvent 514. The first polymer 502 includes a polymer backbone 504 and an ALG 506 chemically bonded to the polymer backbone 504. In the present embodiment, the first polymer 502 further includes a polar unit 508 chemically bonded to the polymer backbone 504. The polar unit 508 is generally capable of increasing adhesion of the resist layer 406 with an under-layer such as the material layer 404. In some embodiments, the polar unit 508 may be hydroxyl adamantane, norbornane lactone, γ-butyrolactone, and derivatives thereof. In the present embodiment, the resist material 500 further includes a silicon-containing unit 518 that is chemically bonded to the ALG 506. The silicon-containing unit 518 may be directly bonded to the ALG 506 or indirectly bonded to the ALG 506 through an intermediate bonding unit 520. The silicon-containing unit 518 serves to increase the etching resistance of the resist layer 406. In the present embodiment, the PAG 512 is blended with the polymer 502 in the solvent 514. The blending of the various components in the solvent 514 may be done by a photoresist provider or at the site of a semiconductor manufacturer. In some embodiments, the resist material 500 further includes a quencher for neutralizing excessive acids produced by the PAG 512 and/or for suppressing resist outgassing. The quencher may be amine derivatives including primary, secondary, tertiary aliphatic or aromatic amine, in some embodiments. In some further embodiments, the resist material 500 includes a surfactant for reducing surface tension between the resist layer 406 and the material layer 404. In various embodiments, the molecular weight of the resist material 500 ranges from 1,000 to 20,000.

Figure 7D:
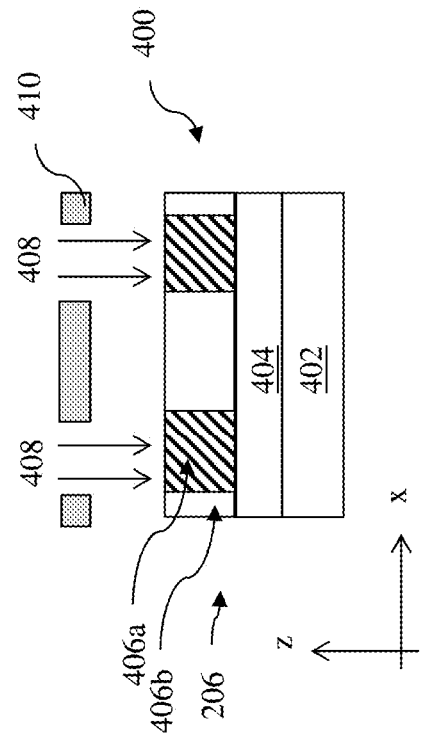

Referring to FIGS. 1 and 7D, the method 100 exposes the resist layer 406 to a radiation beam 408 in a lithography system. Some portions 406a (shaded areas) of the resist layer 406 are exposed by the radiation beam 408, and other portions 406b of the resist layer 406 remain unexposed. The radiation beam 408 may be an I-line light (365 nm), a DUV radiation such as KrF excimer laser (248 nm) or ArF excimer laser (193 nm), a EUV radiation (e.g., 13.5 nm), an e-beam, an x-ray, an ion beam, or other suitable radiations. Operation 108 may be performed in air, in a liquid (immersion lithography), or in a vacuum (e.g., for EUV lithography and e-beam lithography). In an embodiment, the radiation beam 408 is patterned with a mask 410, such as a transmissive mask or a reflective mask, which may include resolution enhancement techniques such as phase-shifting and/or optical proximity correction (OPC). The mask 410 includes various patterns for forming IC features in or on the substrate 402. In another embodiment, the radiation beam 408 is directly modulated with a predefined pattern, such as an IC layout, without using a mask (e.g., maskless lithography using e-beam).

Figure 8B:
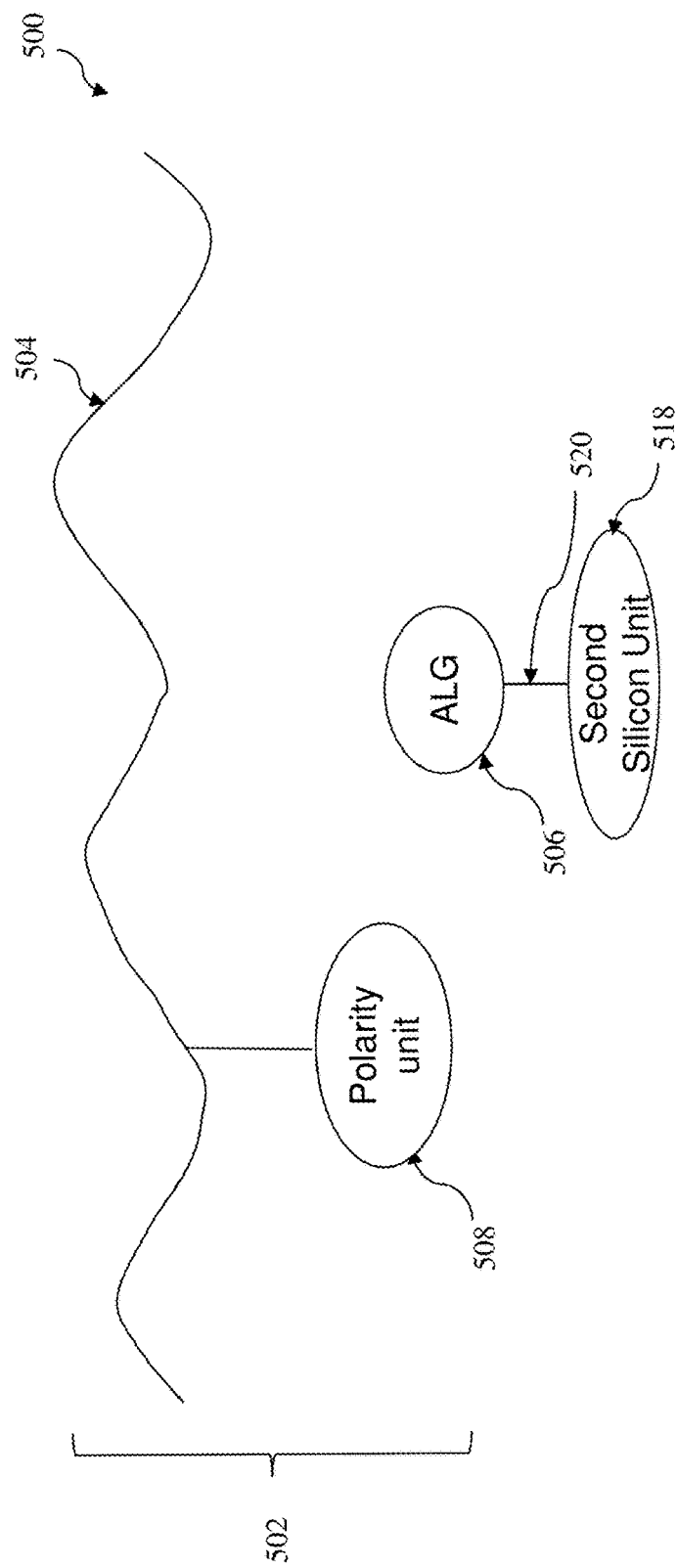
FIG. 8B illustrates a structure of the photoresist of FIG. 8A during a step performed in the method of FIG. 1, in accordance with an embodiment.

In the present embodiment, the exposed portions 406a undergo some chemical changes in response to the radiation 408. For example, with respect to FIG. 8A, the PAG 512 releases an acid in response to the radiation 408. The acid cleaves the ALG 506 off the polymer backbone 504 as illustrated in FIG. 8B, which makes the polymer 402 more hydrophilic. As a result, the exposed portions 406a become soluble in an aqueous solution, such as having 2.38% TMAH. In some embodiments, the method 100 further performs a post-exposure baking (PEB) process to the exposed resist layer 406. The PEB process accelerates the above acid-generation and cleaving reactions. In an embodiment, the PEB process may be performed in a thermal chamber at a temperature ranging between about 120° C. to about 160° C.

In an embodiment, the silicon-containing unit 518 includes silicon-oxygen bonds. In an embodiment, the silicon-containing unit 518 includes a silsesquioxane. For example, the silicon-containing unit 518 may be a cage-type silsesquioxane such as shown in FIGS. 6A, 6B, 6C, and 6D. The silicon-containing unit 518 may also be other types of silsesquioxane. For example, the silicon-containing unit 518 may be an incomplete-cage type silsesquioxane such as shown in FIG. 6E, a ladder type silsesquioxane such as shown in FIG. 6F, or a random type silsesquioxane such as shown in FIG. 6G. In each of the FIGS. 6A-6G, the symbol "L" represents the intermediate bonding unit 520 and the symbol "R" represents the ALG 506.

In an embodiment, the intermediate bonding unit 520 has an aromatic ring structure. Alternatively, the intermediate bonding unit 520 has a chain structure with 0 to 6 carbon atoms. For example, the chain may be a linear chain or a cyclic chain. Further, the chain may comprise an alkyl group, an alkoxy group, a fluoro alkyl group, or a fluoroalkoxy group.

In an embodiment, the ALG 506 is a cyclopentane, a cyclohexane, an adamantane, a norbornane, or a derivative thereof. Typically, the contents of the ALG 506 in the resist material 500 are high. By bonding the silicon-containing unit 518 to the ALG 506, embodiments of the present disclosure substantially increase the etching resistance of the unexposed portions 406b.

Referring to FIGS. 1 and 7E, the method 100 develops the exposed resist layer 406 in a developer 412. The exposed portions 406a are removed by the developer 412 (positive tone imaging), leaving the unexposed portions 406b over the material layer 404 as a resist pattern 406b. In some embodiments, the resist layer 406 experiences a polarity change after the operation 108 and/or the PEB process discussed above, and a dual-tone developing process may be implemented. In some examples, the resist layer 406 is changed from a nonpolar state (hydrophobic state) to a polar state (hydrophilic state), then the exposed portions 406a will be will be removed by an aqueous solvent such as having 2.38% TMAH. In some other examples, the resist layer 406 is changed from a polar state to a nonpolar state, then the exposed portions 406a will be removed by an organic solvent, such as n-BA or its derivative.

Referring to FIGS. 1 and 7F, the method 100 transfers the resist pattern 406b to the substrate 402. In the present embodiment, the operation 112 includes etching the material layer 404 with the resist pattern 406b as an etch mask, thereby transferring the pattern from the resist pattern 406b to the material layer 404. In an embodiment, the material layer 404 is a spin-on coated layer having metal or silicon contents. Due to the increased etching resistance of the resist pattern 406b, the operation 112 is able to fully etch the material layer 404 to from a pattern 404b. The operation 112 may use a dry (plasma) etching, a wet etching, or other suitable etching methods. The resist pattern 406b may be partially consumed during the etching of the material layer 404. In an embodiment, any remaining portion of the resist pattern 406b may be stripped off, leaving a patterned material layer 404b over the substrate 402, as illustrated in FIG. 7F.

Although not shown in FIG. 1, the method 100 may proceed to etching the substrate 202 or 402 with the patterned material layer 204a or 404b, respectively, as an etch mask, thereby forming a final pattern or an IC device on the substrate 202 or 402. For example, the method 100 may form shallow trench isolation (STI) features for defining transistor active regions, may form fin-like protrusions in the respective substrates for forming FinFETs, may form contact holes for transistor source/drain/gate contacts, and may form interconnect features.

Although not intended to be limiting, one or more embodiments of the present disclosure provide many benefits to semiconductor photolithography processes. For example, a resist material or composition constructed according to the present disclosure may be used for forming a resist pattern with increased etching resistance. This resist pattern may be used for directly etching a thick spin-on coated under-layer in photolithography, thereby saving manufacturing costs.

In one exemplary aspect, the present disclosure is directed to a method for lithography patterning. The method includes forming a photoresist layer over a substrate, wherein the photoresist layer includes a polymer backbone, an acid labile group (ALG) chemically bonded to the polymer backbone, a photo-acid generator (PAG), a solvent, and a silicon-containing unit chemically bonded to a crosslinker. The method further includes performing an exposing process to the photoresist layer; and developing the photoresist layer, thereby forming a patterned photoresist layer.

In another exemplary aspect, the present disclosure is directed to a method for lithography patterning. The method includes forming a photoresist layer over a substrate, wherein the photoresist layer includes a polymer backbone, an acid labile group (ALG) chemically bonded to the polymer backbone, a photo-acid generator (PAG), a solvent, and a silicon-containing unit chemically bonded to the ALG. The method further includes performing an exposing process to the photoresist layer; and developing the photoresist layer, thereby forming a patterned photoresist layer.

In another exemplary aspect, the present disclosure is directed to a photoresist. The photoresist comprises a polymer backbone, an acid labile group (ALG) chemically bonded to the polymer backbone, a photo-acid generator (PAG), a solvent, and a silicon-containing unit that is chemically bonded to one of: the ALG and a crosslinker.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
    forming a polymeric material layer on a substrate by spin coating;
    forming a photoresist layer over the polymeric material layer, wherein the photoresist layer includes a polymer backbone, an acid labile group (ALG) chemically bonded to the polymer backbone, a photo-acid generator (PAG), a solvent, and a silicon-containing unit chemically bonded to the ALG, and wherein the polymeric material layer and the photoresist layer have different optical properties with respect to radiation, and wherein the ALG includes norbornane, adamantine or a derivative thereof;
    performing an exposing process to the photoresist layer using the radiation; and
    developing the photoresist layer, thereby forming a patterned photoresist layer.

2. The method of claim 1, further comprising:
    baking the photoresist layer before the developing of the photoresist layer.

3. The method of claim 1, wherein the developing of the photoresist layer removes portions of the photoresist layer that are exposed by the exposing process.

4. The method of claim 1, wherein the silicon-containing unit is chemically bonded to the ALG through an intermediate bonding unit.

5. The method of claim 4, wherein the intermediate bonding unit comprises an aromatic ring or a chain with 1 to 6 carbon atoms.

6. The method of claim 5, wherein the chain comprises an alkyl group, an alkoxy group, a fluoro alkyl group, or a fluoroalkoxy group.

7. The method of claim 1, wherein the ALG connects to the silicon-containing unit via an aromatic ring.

8. The method of claim 1, wherein the silicon-containing unit comprises a silsesquioxane.

9. The method of claim 8, wherein the silsesquioxane is a cage silsesquioxane, an incomplete cage silsesquioxane, a ladder silsesquioxane, or a random silsesquioxane.

10. The method of claim 1, wherein the photoresist layer further includes a polar unit chemically bonded to the polymer backbone, the polar unit comprising hydroxyl adamantine, norbornane lactone, γ-butyrolactone, or derivatives thereof.

11. The method of claim 1, wherein the polymeric material layer and the photoresist layer differ in at least one of the following optical properties: refractive index (n), extinction coefficient (k), and spectroscopic transmittance (T).

12. The method of claim 1, wherein the exposing process changes the photoresist layer from a nonpolar state to a polar state.

13. The method of claim 1, wherein the exposing process changes the photoresist layer from a polar state to a nonpolar state.

14. The method of claim 1, wherein a molecular weight of the photoresist layer ranges from 1,000 to 20,000.

15. A method, comprising:
    forming a photoresist layer over a substrate, wherein the photoresist layer includes a polymer backbone, an acid labile group (ALG) chemically bonded to the polymer backbone, a photo-acid generator (PAG), a solvent, and a silicon-containing unit chemically bonded to the ALG, wherein the ALG includes norbornane, adamantine or a derivative thereof;
    performing an exposing process to the photoresist layer, wherein the exposing process changes the photoresist layer from a nonpolar state to a polar state; and
    developing the photoresist layer, thereby forming a patterned photoresist layer.

16. The method of claim 15, wherein the silicon-containing unit is chemically bonded to the ALG directly without any intermediate bonding unit.

17. The method of claim 15, wherein the ALG connects to the silicon-containing unit via an aromatic ring.

18. The method of claim 15, wherein the silicon-containing unit comprises a silsesquioxane.

19. A method, comprising:
    forming a polymeric material layer on a substrate by spin coating;
    forming a photoresist layer over the polymeric material layer, wherein the photoresist layer includes a polymer backbone, an acid labile group (ALG) chemically bonded to the polymer backbone, a photo-acid generator (PAG), a solvent, and a silicon-containing unit chemically bonded to the ALG, and wherein the polymeric material layer and the photoresist layer differ in at least one of the following optical properties: refractive index (n), extinction coefficient (k), and spectroscopic transmittance (T), wherein the ALG includes norbornane, adamantine or a derivative thereof;
    performing an exposing process to the photoresist layer; and
    developing the photoresist layer, thereby forming a patterned photoresist layer.

* * * * *